United States Patent
Kang et al.

(10) Patent No.: US 7,688,622 B2
(45) Date of Patent: Mar. 30, 2010

(54) PHASE CHANGE MEMORY DEVICE WITH DUMMY CELL ARRAY

(75) Inventors: Hee Bok Kang, Chungcheongbuk-do (KR); Suk Kyoung Hong, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 116 days.

(21) Appl. No.: 12/134,349

(22) Filed: Jun. 6, 2008

(65) Prior Publication Data

US 2009/0190393 A1 Jul. 30, 2009

(30) Foreign Application Priority Data

Jan. 30, 2008 (KR) .................. 10-2008-0009612

(51) Int. Cl.
*G11C 11/00* (2006.01)
(52) U.S. Cl. .................. 365/163; 365/210.1; 365/202; 365/203
(58) Field of Classification Search ........... 365/163, 365/210.1, 204, 203
See application file for complete search history.

(56) References Cited

U.S. PATENT DOCUMENTS 7,379,328 B2 * 5/2008 Osada et al. ............... 365/163
7,388,775 B2 * 6/2008 Bedeschi et al. ........... 365/163

FOREIGN PATENT DOCUMENTS

| KR | 1020050102952 A | 10/2005 |
| KR | 1020050105546 A | 11/2005 |
| KR | 1020060134308 A | 12/2006 |
| KR | 1020070018583 A | 2/2007 |

* cited by examiner

*Primary Examiner*—Huan Hoang
(74) *Attorney, Agent, or Firm*—Ladas & Parry LLP (57) ABSTRACT

A phase change memory device includes a cell array having a phase change resistance cell arranged at an intersection of a word line and a bit line and a dummy cell configured to discharge the bit line in response to a first bit line discharge signal. A column switching unit selectively controls a connection between the bit line and a global bit line in response to a column selecting signal. The dummy cell disconnects a discharging path in response to the first bit line discharge signal in a precharge mode, and discharges the bit line in response to the first bit line discharge signal in an active mode.

19 Claims, 13 Drawing Sheets

PHASE CHANGE MEMORY DEVICE WITH DUMMY CELL ARRAY

The present application is based upon and claims priority to Korean Patent Application No. 10-2008-0009612 filed on Jan. 30, 2008, the entire contents of which are incorporated herein by reference.

BACKGROUND

The present invention relates generally to a phase change memory device, and more particularly to a technology of activating a dummy cell array configured to form a discharging path of a bit line in an active mode to prevent an excessive leakage current in a precharge mode.

A nonvolatile memory has a data processing speed similar to that of a volatile Random Access Memory (RAM), however, unlike a volatile RAM, a nonvolatile memory conserves data even when no power is supplied to the memory, that is, after the power is turned off.

Figure 1A:
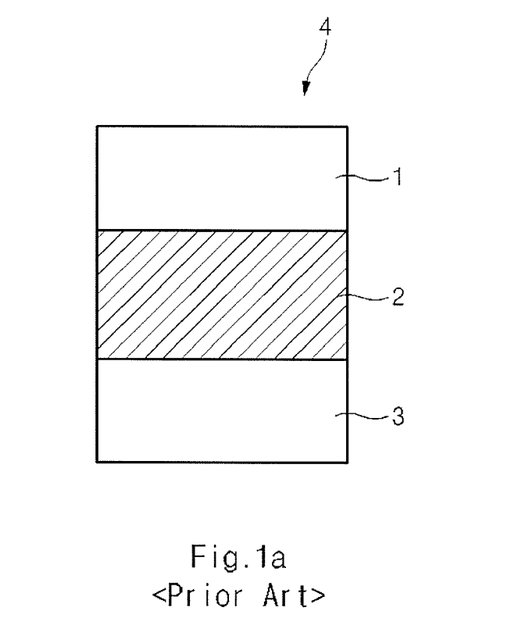
FIGS. 1a and 1b are diagrams showing a conventional phase change resistor.
Figure 1B:
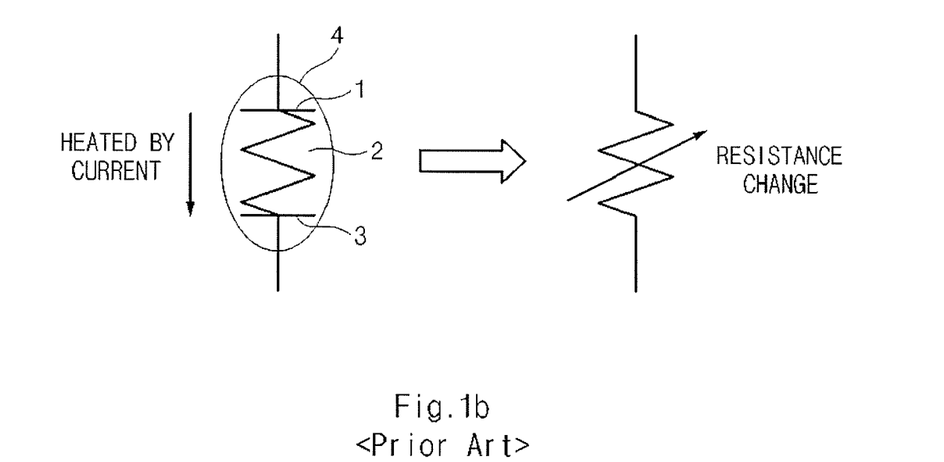

FIGS. 1a and 1b are diagrams showing a conventional phase change resistor (PCR) 4.

The PCR 4 comprises a phase change material (PCM) 2 inserted between an upper electrode 1 and a lower electrode 3. When a voltage and a current are applied to the PCR 4, a high temperature is generated in the PCM 2 such that an electric conductive state of the PCR 4 is changed depending on the resistance of the PCM 2. The PCM may comprise AgLnSbTe. The PCM 2 may also comprise chalcogenide having chalcogen elements (S, Se, Te) as a main ingredient, for example, a germanium antimonic tellurium consisting of Ge—Sb—Te.

Figure 2A:
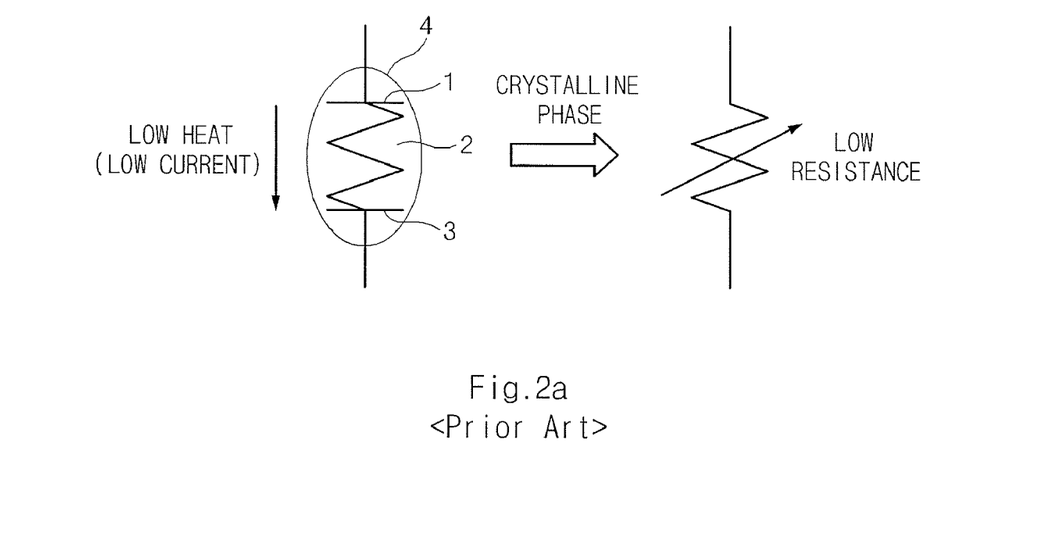
FIGS. 2a and 2b are diagrams showing the principle operation of the conventional phase change resistor.
Figure 2B:
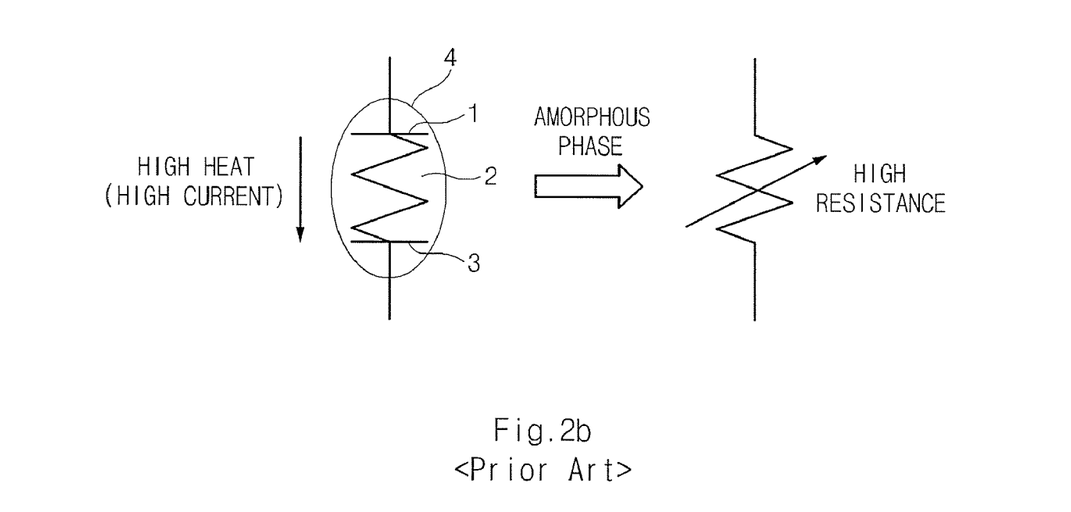

FIGS. 2a and 2b are diagrams showing the principle operation of the conventional PCR 4.

As shown in FIG. 2a, the PCM 2 can be crystallized when a low current, i.e., a current less than a threshold value, flows through the PCR 4. As a result, the PCM2 becomes a crystalline phase, that is the PCM 2 becomes a low resistance material.

As shown in FIG. 2b, the PCM 2 can be amorphized when a high current, i.e., a current higher than a threshold value, flows through the PCR 4. That is, the temperature of the PCM 2 is increased higher than its melting point when a high current flows through the PCR 4. As a result, the PCM 2 becomes an amorphous phase, that is, the PCM 2 becomes a high resistance material.

In this way, the PCR 4 is configured to store nonvolatile data corresponding to the two resistance states. That is, data "1" refers to a low resistance state of the PCR 4, and data "0" refers to a high resistance state of the PCR 4 so that the data can be stored to have one of the two logic states.

Figure 3:
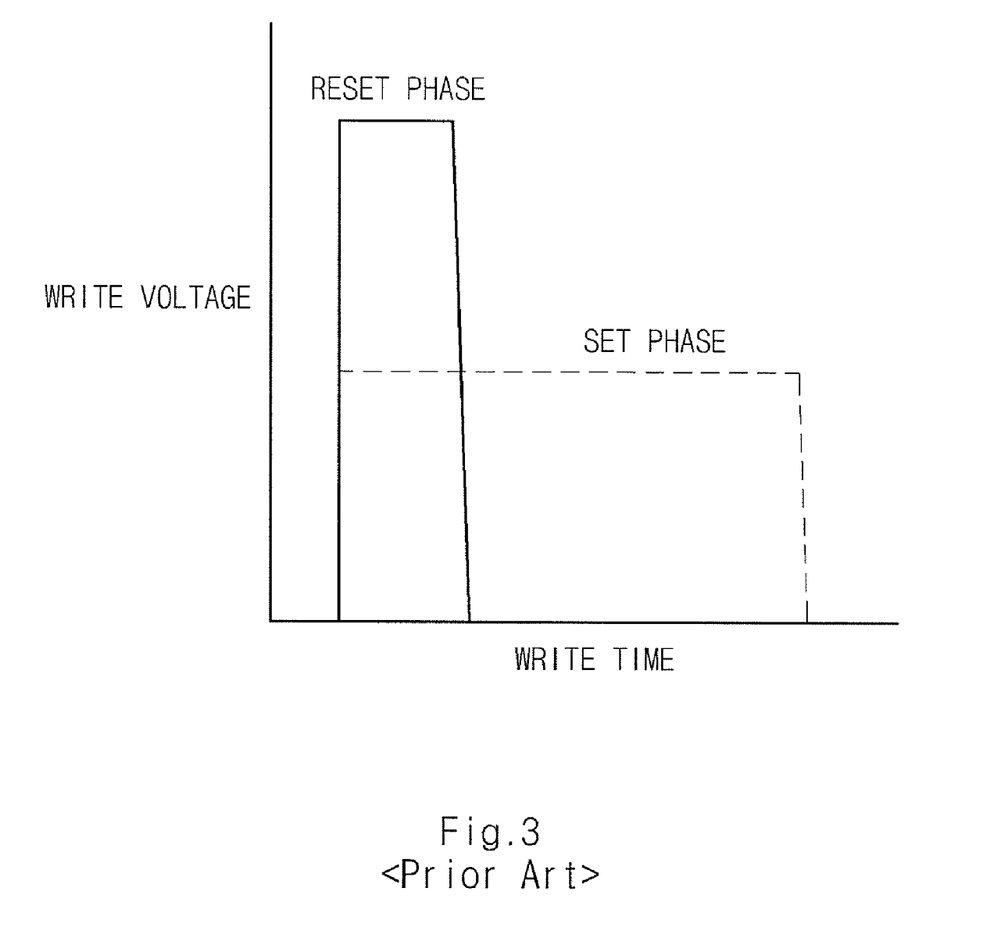
FIG. 3 is a diagram showing a write operation of a conventional phase change resistant cell.

FIG. 3 is a diagram showing a write operation of a conventional phase change resistant cell.

Heat is generated when a current flows through the upper electrode 1 and the lower electrode 3 of the PCR 4 for a given time. As a result, a state of the PCM 2 is changed to be either the crystalline phase or the amorphous phase depending on the current applied to the upper electrode 1 and the lower electrode 3.

A low temperature heating state occurs when a low current flows through the upper electrode 1 and the lower electrode 3 for a given time. As a result the PCM 2 becomes the crystalline phase and the PCR 4, which acts as a low resistor, is at a set state. On the other hand, a high temperature heating state occurs when a high current flows between the upper electrode 1 and the lower electrode 3 for a given time. As a result, the PCM 2 becomes the amorphous phase and the PCR 4, which acts as a high resistor, is at a reset state. Therefore, the two different phases are represented by the change of the electric resistance of the PCR 4.

As shown in FIG. 3, a low voltage is applied to the PCR 4 for a period of time in order to write the set state in a write mode. On the other hand, a high voltage is applied to the PCR 4 for a shorter period of time in order to write the reset state in the write mode.

Figure 4:
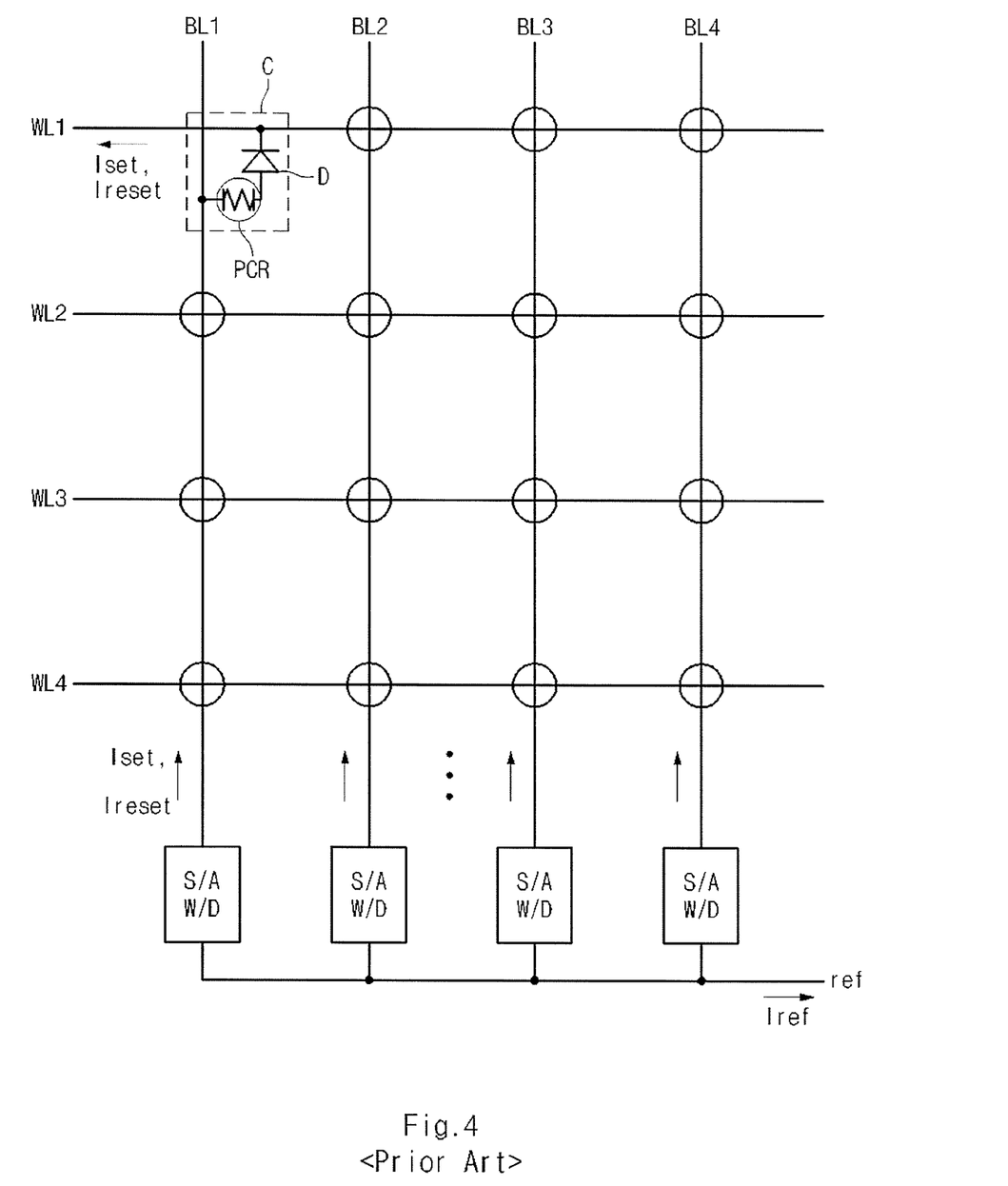
FIG. 4 is a diagram showing a cell array of a conventional phase change memory device.

FIG. 4 is a diagram illustrating a cell array of a conventional phase change memory device.

As shown in FIG. 4, a conventional phase change memory device includes a plurality of unit cells C positioned at the intersections of a plurality of bit lines BL1~BL4 and a plurality of word lines WL1~WL4. Each unit cell C may include a phase change resistor PCR and a diode D. The diode D may include a PN diode element.

In the unit cell C, a first electrode of the PCR is connected to the bit line BL1 and a second electrode of the PCR is connected to a P-type region of the diode D. Further, an N-type region of the diode D is connected to the word line WL1.

In a read mode, a low voltage may be applied to a selected word line WL and a read voltage Vread may be applied to the bit line BL. As a result, a read current Iset having a set state or a read current Ireset having a reset state may flow towards the word line WL through the bit line BL, the PCR, and the diode D.

A sense amplifier S/A senses cell data received from a bit line BL, and compares the cell data with a reference voltage Vref to distinguish data "1" from data "0". A reference current Iref may flow in a terminal for receiving the reference voltage Vref. A write driving unit W/D supplies a driving voltage corresponding to write data to the bit line BL when data are written in a unit cell C.

SUMMARY

The present invention includes a phase change memory device using a phase change resistance cell that comprises a dummy cell array for performing a bit line switch function without a circuit for forming a discharging path.

An embodiment of the present invention provides a phase change memory device comprising a dummy cell array for forming a discharging path of a bit line to improve a characteristic of a main cell, thereby reducing a layout area.

An embodiment of the present invention provides a phase change memory device comprising a dummy cell array for forming a discharging path of a bit line which is activated in an active mode not to generate an excessive leakage current by the dummy cell array in a precharge mode.

According to an embodiment of the present invention, a phase change memory device comprises: a cell array including a phase change resistance cell arranged at an intersection of a word line and a bit line and a dummy cell configured to discharge the bit line in response to a first bit line discharge signal; a column switching unit configured to selectively control connection between the bit line and a global bit line in response to a column selecting signal. The dummy cell disconnects a discharging path in response to the first bit line discharge signal in a precharge mode, and discharges the bit line in response to the first bit line discharge signal in an active mode.

DESCRIPTION OF EMBODIMENTS

Figure 5:
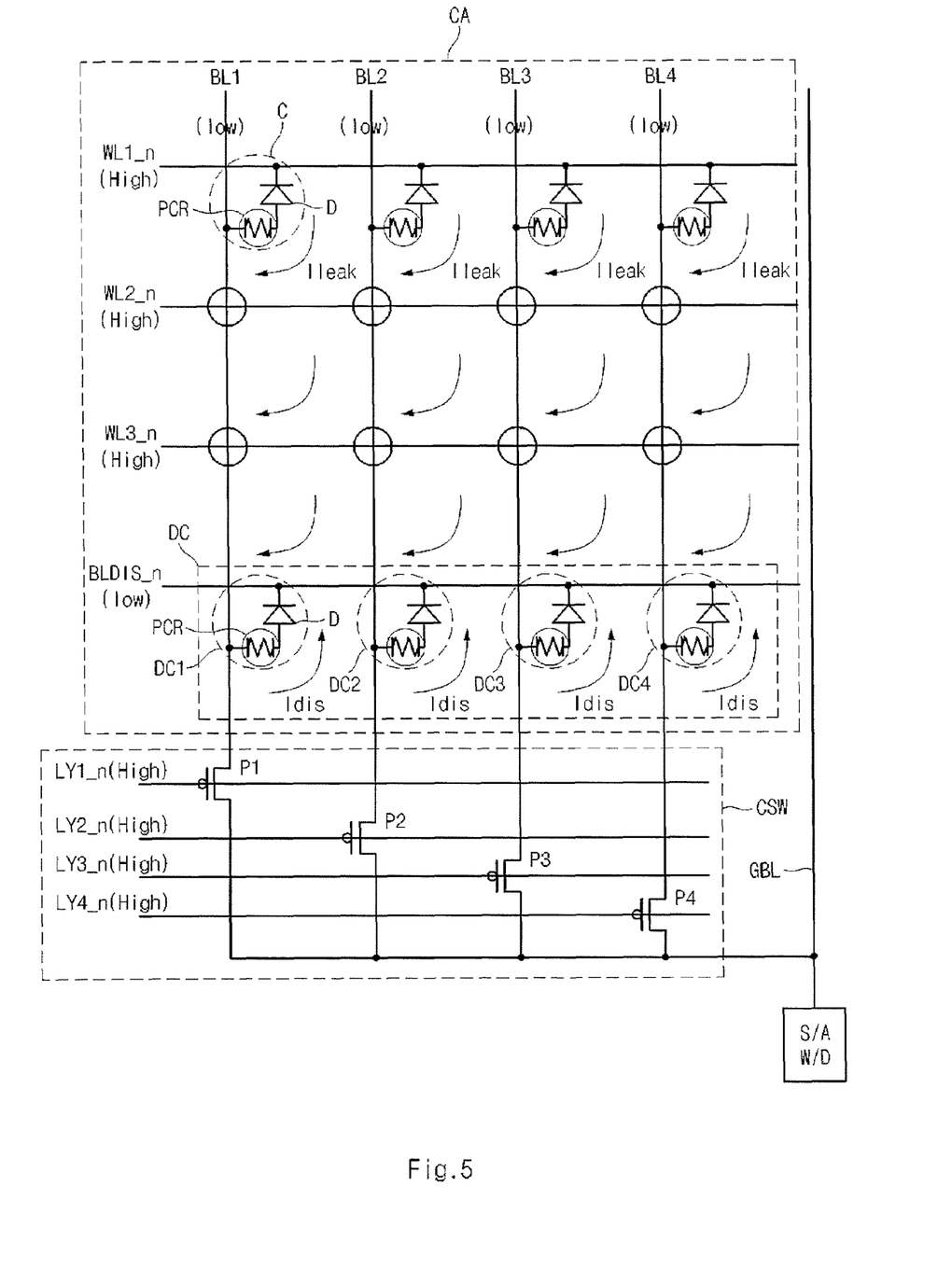
FIG. 5 is a diagram showing a phase change memory device according to an embodiment of the present invention.

FIG. 5 is a diagram illustrating a phase change memory device according to an embodiment of the present invention.

As shown in FIG. 5, a phase change memory device includes a cell array CA and a column switching unit CSW. The cell array CA includes a unit cell C and a dummy cell DC. The unit cell C is positioned at an intersection of a bit line BL1 and a word line WL1_n. The unit cell C may include a phase change resistor PCR and a diode D. The diode D may include a PN diode element.

A first electrode of the PCR is connected to the bit line BL1 and a second electrode of the PCR is connected to a P-type region of the diode D. An N-type region of the diode D is connected to the word line WL1_n.

The dummy cell DC includes a plurality of dummy unit cells DC1~DC4 each positioned at an intersection of a bit line BL and a terminal for receiving a bit line discharge signal BLDIS_n. The dummy cell DC is formed to discharge charges of the bit line in a precharge mode, and has the same structure as that of the unit cell C as will be described below.

Each of the dummy unit cells DC1~DC4 includes a phase change resistor PCR and a diode D. The diode D may include a PN diode element. A first electrode of the PCR is connected to a bit line BL and a second electrode of the PCR is connected to a P-type region of the diode D. An N-type region of the diode D is connected to the terminal for receiving the bit line discharge signal BLDIS_n.

The column switching unit CSW includes a plurality of PMOS transistors P1~P4. The PMOS transistors P1~P4 connected between the bit line BL and a global bit line GBL. The gates of the PMOS transistors P1~P4 receive the column selecting signals LY1_n~LY4_n. The PMOS transistors P1~P4 are selectively switched on in response to the column selecting signals LY1_n~LY4_n and control the connection between the bit lines BL1~BL4 and the global bit line GBL. In an active mode, one of the column selecting signals LY1_n~LY4_n is activated and selects the unit cell C connected to the corresponding bit line BL.

A sense amplifier S/A senses the cell data received from the global bit line GBL, and compares the cell data with a reference voltage to distinguish data "1" from data "0". A reference current Iref may flow through a terminal receiving the reference voltage. When data are written in a unit cell C, a write driving unit W/D supplies a driving voltage, which corresponds to the write data, to the global bit line GBL.

In the active mode, the bit line discharge signal BLDIS_n is transitioned to a high voltage level thereby forming a current path. At this time a low voltage is applied to a selected word line WL in a read mode and a read voltage Vread may be applied to a bit line BL. As a result, a read current Iset in the set state or a read current Ireset in the reset state may flow towards a word line WL through a bit line BL, the PCR, and the diode D.

On the other hand, if the bit line discharge signal BLDIS_n is maintained at a low level in the precharge mode, the bit line BL is discharged to a ground voltage level. In this case, the column selecting signals LY1_n~LY4_n are maintained at a high level and therefore are switched-off.

And then, a high level voltage is applied to all word lines WL1_n~WL3_n. When the bit line discharge signal BLDIS_n transitions to the low level, a leakage current Ileak, which is applied to the dummy cell DC through the bit line BL, is discharged to the terminal receiving the bit line discharge signal BLDIS_n.

The leakage current Ileak of the unit cell C flows from the word line WL to the bit line BL via the dummy cell DC and is discharged as a discharge current Idis through the dummy cell DC. As a result, the bit line BL maintains a low voltage level.

However, when the cell leakage current Ileak is greater than a given value, the leakage current of the whole cell may exceed a standby current. As a forward current of the diode D increases, a backward leakage current also increases. As a result, the sum of each current of the whole memory cells may exceed a standard value of the standby current.

Figure 6:
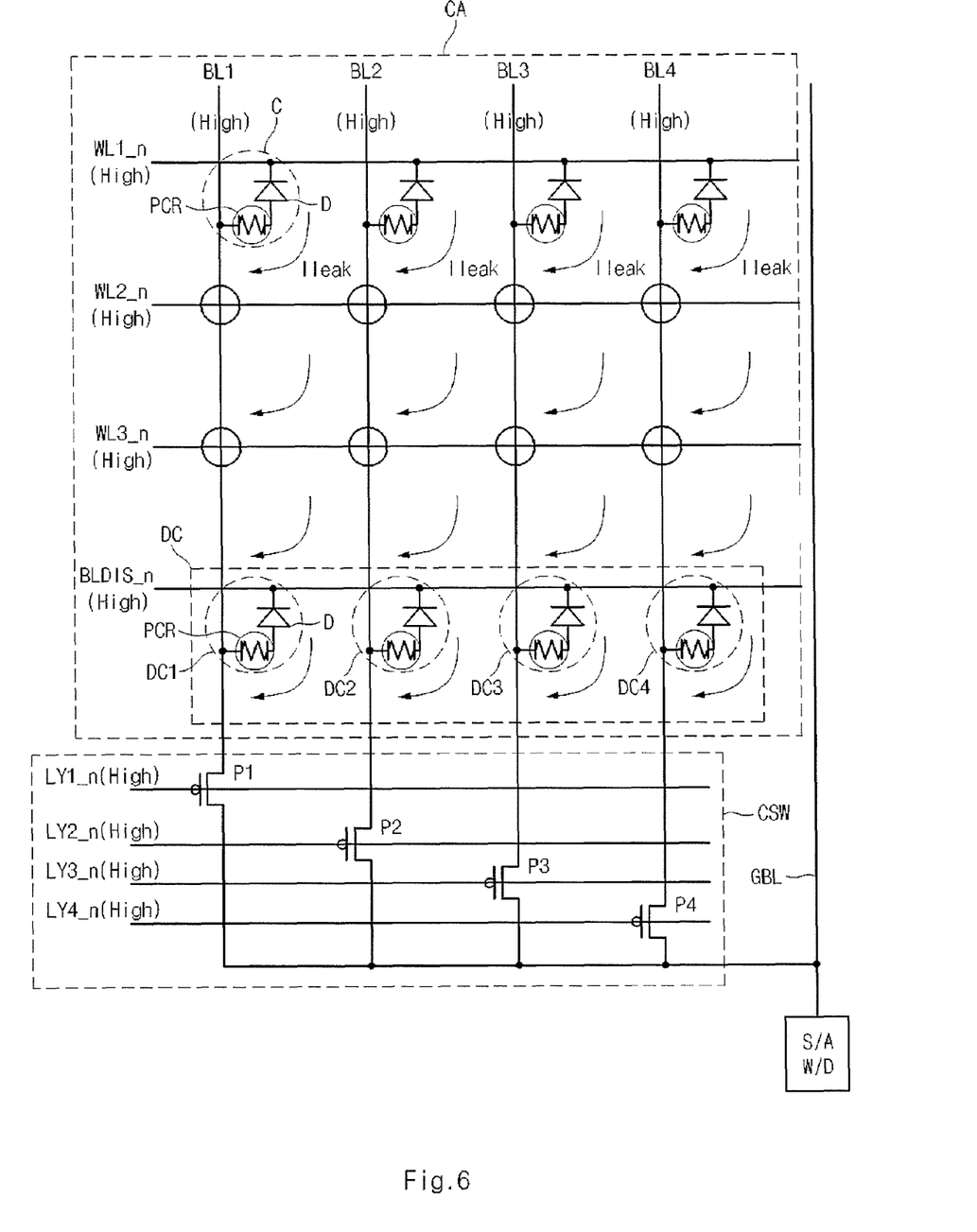
FIG. 6 is a diagram showing a precharge mode bias condition of a phase change memory device according to an embodiment of the present invention.

FIG. 6 is a diagram showing a precharge mode bias condition of a phase change memory device according to an embodiment of the present invention. The phase change memory device of FIG. 6 has substantially the same structure as that of FIG. 5. However, the phase change memory device of FIG. 6 includes a bias condition in the precharge mode that prevents the leakage current Ileak, which flows through the whole cells, from exceeding a standby current.

As shown in FIG. 6, during the precharge mode a high voltage level is applied to all word lines WL and the bit line discharge signal BLDIS_n transitions to a high level. The leakage current Ileak flows from a word line WL to a bit line BL via the dummy cell DC, but the leakage current Ileak is not discharged to the terminal receiving the bit line discharge signal BLDIS_n.

In this case, the column selecting signals LY1_n~LY4_n are maintained at the high level, and as such the PMOS transistors P1~P4 are all switched-off.

In this case, a voltage of the bit line BL is maintained at a high level, because the leakage current Ileak of the unit cell C, which flows from the word line WL to the bit line BL via the dummy cell DC, is not discharged to the discharge current Idis. When the bit line BL is precharged to the high voltage level as described above, the discharge path is disconnected and the leakage current Ileak no longer flows. As a result, the leakage current Ileak of each cell does not exceed the standby current value.

Figure 7:
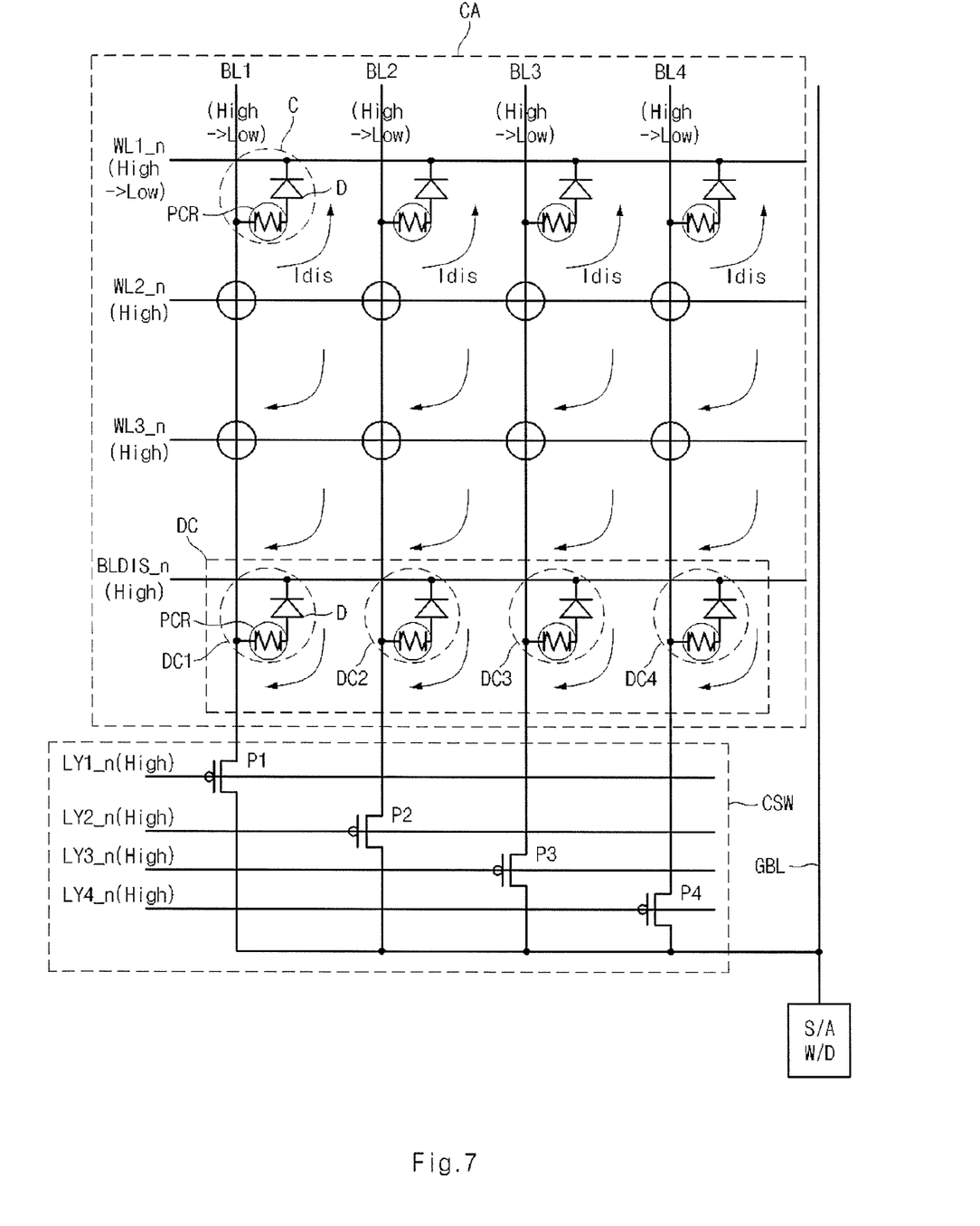
FIG. 7 is a diagram showing a bias condition in change into an active mode of a phase change memory device according to an embodiment the present invention.

FIG. 7 is a diagram showing a bias condition of a phase change memory device according to an embodiment of the present invention when the mode is changed from the precharge mode to the active mode. The phase change memory device of FIG. 7 has the same structure as that of FIG. 6.

When the mode is changed from the precharge mode to the active mode, the word line WL1_n selected from the word lines WL1_n~WL3_n transitions from a high voltage level to a low voltage level, the unselected word lines WL2 and WL3 maintain the high voltage level, and the bit line discharge signal BLDIS_n maintains the high level.

Therefore, the leakage current Ileak, which flows from the word line WL to the beat line BL via the dummy cell DC, is not discharged to the terminal receiving the bit line discharge signal BLDIS_n and the column selecting signals LY1_n~LY4_n are maintained at the high level so as to maintain the PMOS transistors P1~P4 in a switched-off state.

In other words, the leakage current Ileak, which flows from the word line WL to the bit line BL via the dummy cell DC, is not discharged as the discharge current Idis. When the selected word line WL1_n transitions from the high voltage level to the low voltage level, any charges that are precharged in the bit line BL are discharged as the discharge current Idis through the selected word line WL1_n.

When the peak value of the current discharged through the word line WL1_n exceeds the level of the reset write current Ireset, cells programmed as a reset state are degraded to be programmed as a set state.

Figure 8:
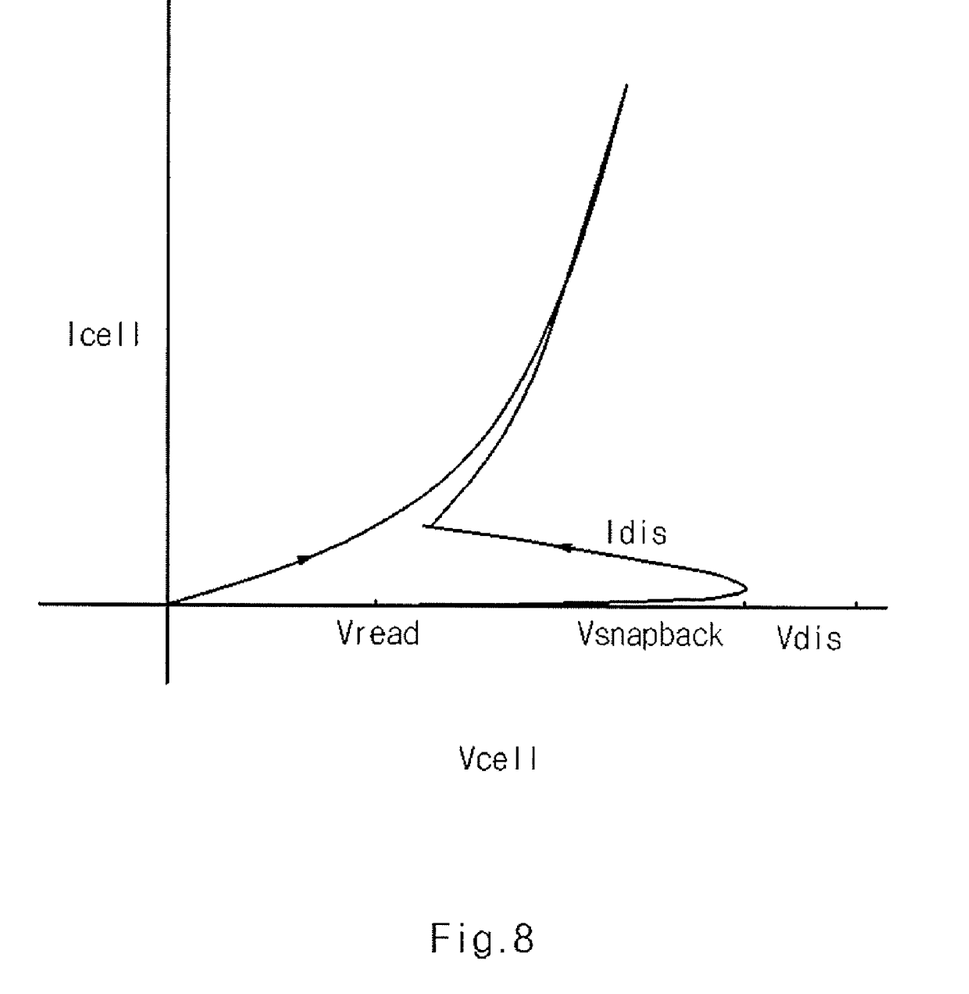
FIG. 8 is a graph showing a voltage current characteristic in a cell program of the phase change memory device of FIG. 7.

FIG. 8 is a graph showing a voltage current characteristic in a cell program of the phase change memory device of FIG. 7.

At an initial state, when data stored in the unit cell C has a reset state and a cell voltage Vcell that is higher than a snap back voltage Vsnapback, the data is changed from the reset state to a write current state.

As shown in FIG. 7, when an initial precharge voltage of a bit line BL is set to be higher than the snap back voltage Vsnapback and a word line WL is activated to a low level, the selected cells are controlled in a snap back mode. Therefore, the cells are degraded.

A discharging path of the dummy cell DC is formed during the first portion of the active period t1 when the mode is changed from the precharge mode to the active mode in order to prevent the degradation of the cells. As a result, charges stored in the bit line BL prevent the degradation of the cells.

Figure 9:
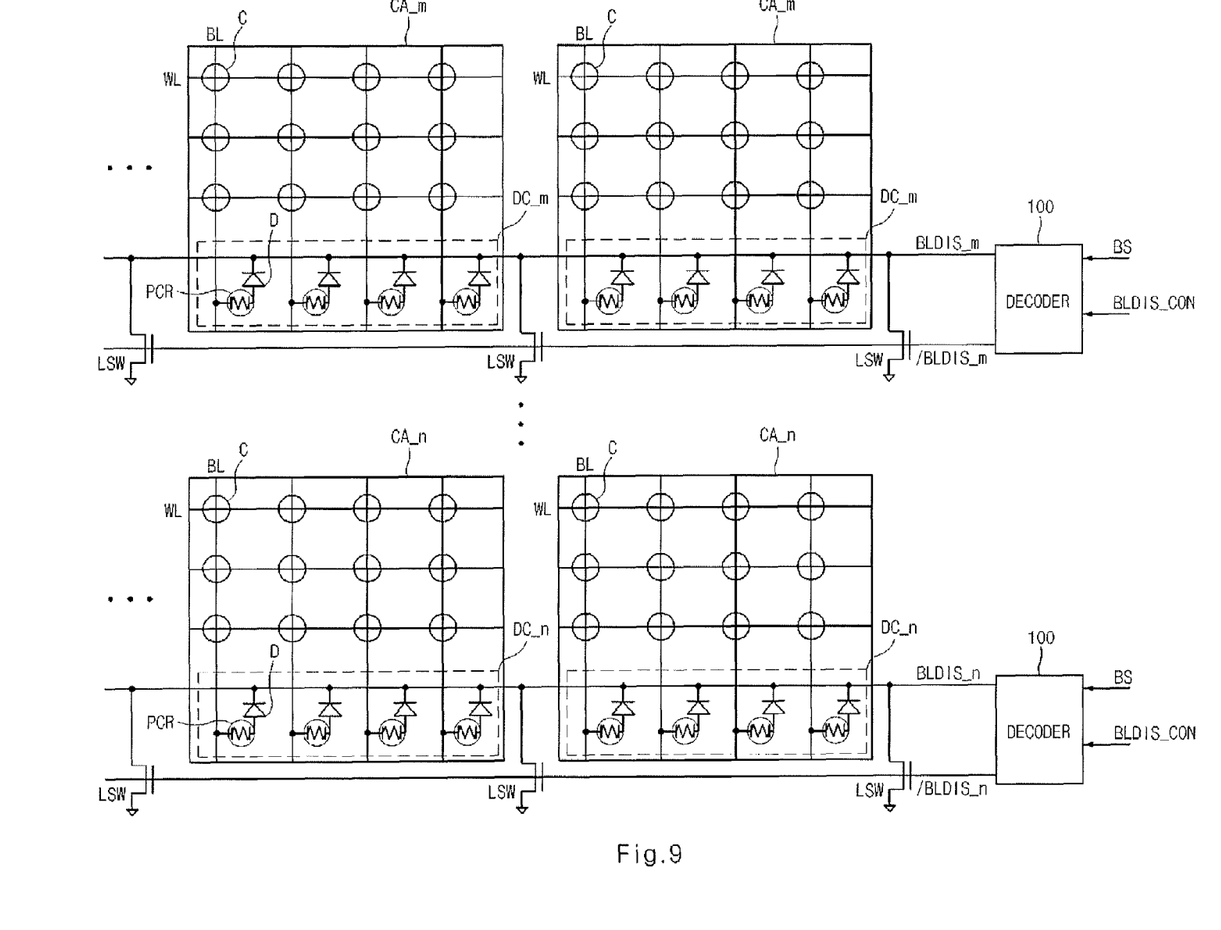
FIG. 9 is a diagram showing a local switch and a decoder of the phase change memory device of FIG. 7.

FIG. 9 is a diagram showing a local switch LSW and a decoder 100 of the phase change memory device of FIG. 7.

The local switch LSW is disposed between a plurality of cell array CA blocks. The local switch LSW includes an NMOS transistor.

The local switch LSW is connected between the terminal receiving the bit line discharge signal BLDIS_n and a ground voltage terminal and the gate of the local switch LSW receives an output signal of the decoder 100. The decoder 100 receives a block selecting signal BS and a bit line discharge control signal BLDIS_CON. The decoder 100 selects a main cell block according to the block selecting signal and outputs the discharge signals BLDIS_n and /BLDIS_n according to the discharge control signal BLDIS_CON. The bit line discharge signal /BLDIS_n is an inversion signal of the bit line discharge signal BLDIS_n.

The local switch LSW is operated in response to the bit line discharge signal /BLDIS_n, and therefore the terminal receiving the bit line discharge signal BLDIS_n can be discharged to a ground voltage level. That is, when the bit line discharge signal /BLDIS_n is activated to a high level so as to turn on the local switch LSW, the terminal receiving the bit line discharge signal BLDIS_n is discharged to the low level.

During the first portion of an active period (t1), the bit line discharge signal BLDIS_n is transitioned to the low level, and as a result the bit line BL is discharged to a ground voltage level. In this case, the column selecting signals LY1_n~LY4_n are maintained at the high level, so as to maintain the PMOS transistors P1~P4 in a switched-off state. On the other hand, during the precharge mode (period t0), the bit line discharge signal BLDIS_n transitions to the high voltage level so as to disconnect the discharging path of the dummy cell DC.

Figure 10:
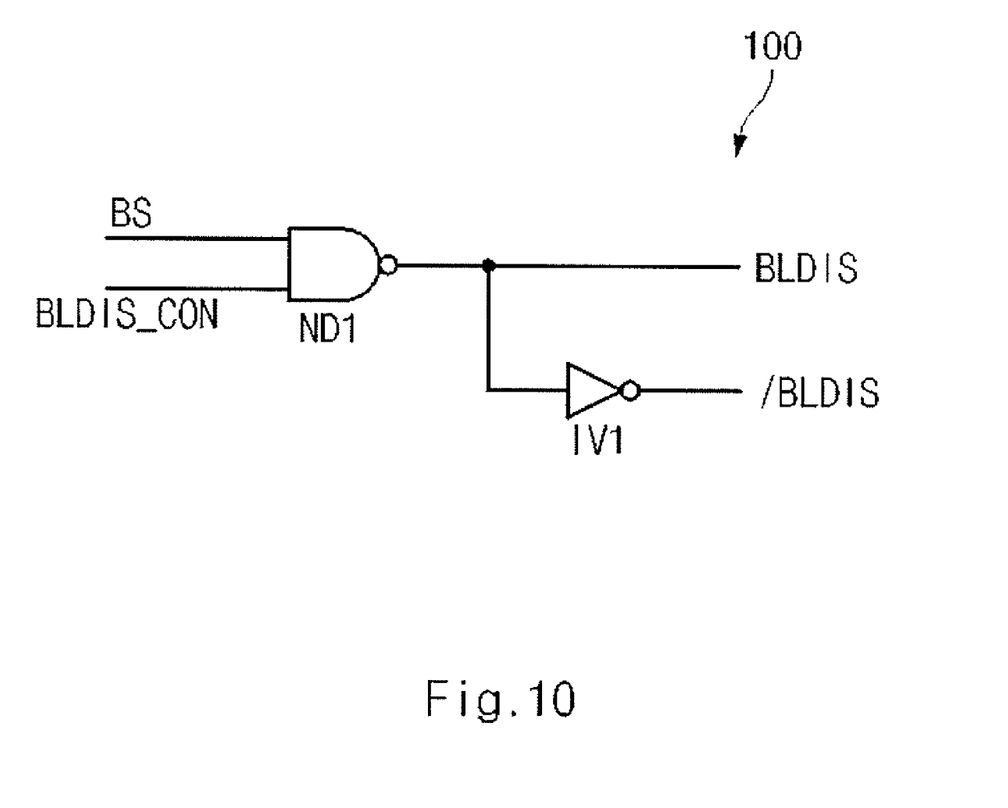
FIG. 10 is a circuit diagram showing the decoder of FIG. 9.

FIG. 10 is a circuit diagram illustrating the decoder 100 of FIG. 9.

The decoder 100 includes a NAND gate ND1 and an inverter IV1. The NAND gate ND1 outputs the bit line discharge signal BLDIS by performs a logic NAND operation of the block selecting is signal BS and the discharge control signal BLDIS_CON. The inverter IV1 outputs the bit line discharge signal /BLDIS inverting the bit line discharge signal BLDIS.

The block selecting signal BS is a signal for selecting a main cell block, and the discharge control signal BLDIS_CON having a high level is received by operating the dummy cell DC in the precharge mode when the discharging path is disconnected.

Figure 11:
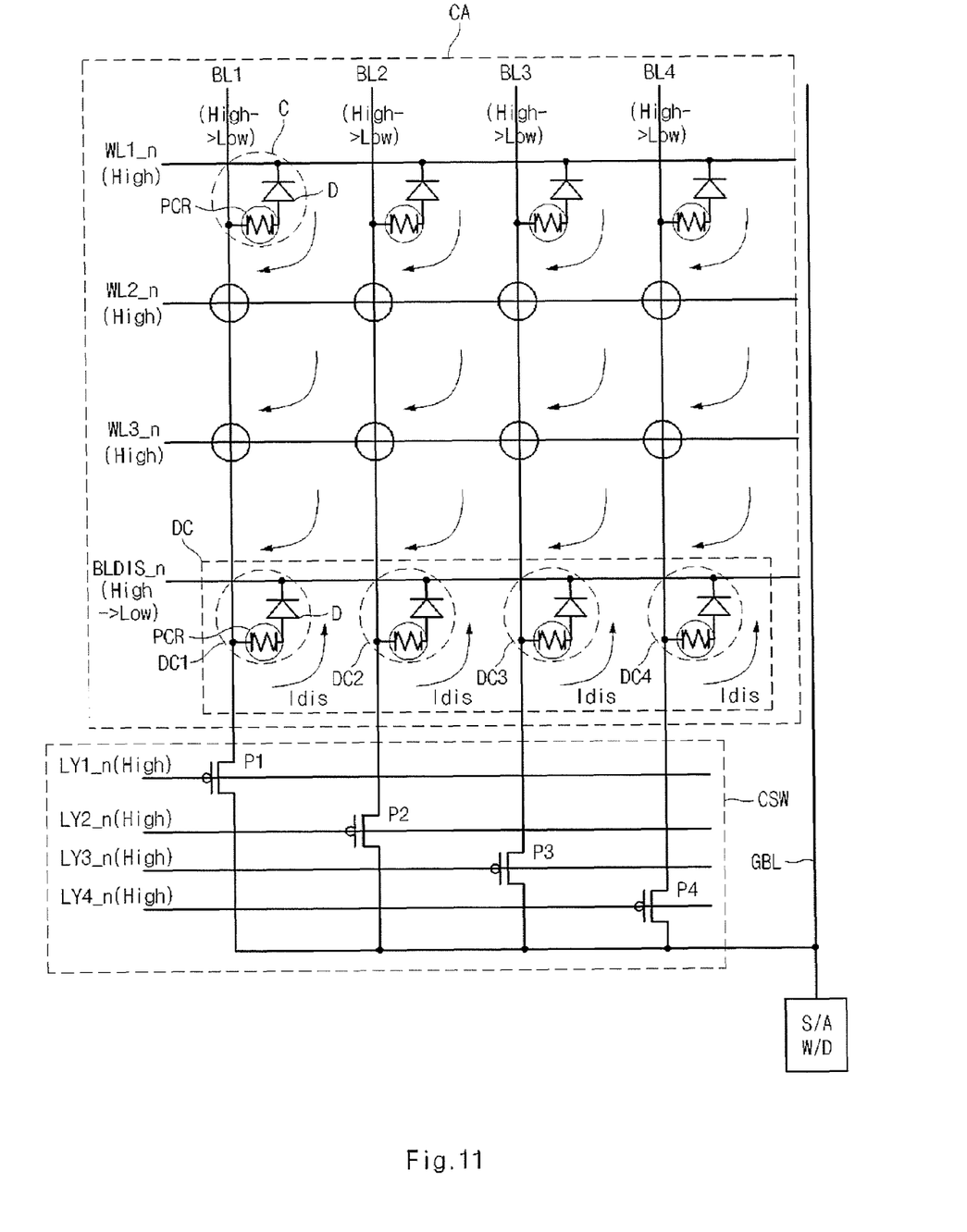
FIG. 11 is a diagram showing an operation of a phase change memory device during a first portion of the active period according to an embodiment of the present invention.

FIG. 11 is a diagram showing an initial active operation of a phase change memory device according to an embodiment of the present invention when the mode is changed from the precharge mode to the active mode. The phase change memory device of FIG. 11 has the same structure as that of FIG. 7.

In the initial operation (from the precharge mode to the active mode) a high voltage level is applied to the word lines WL1_n~WL3_n. Also, the bit line discharge signal BLDIS_n transitions from the high voltage level to the low voltage level.

The leakage current Ileak, which flows from the word line WL to the bit line BL via the dummy cell DC, is discharged to the terminal receiving the bit line discharge signal BLDIS_n. The column selecting signals LY1_n~LY4_n are maintained at the high level, so as to maintain the PMOS transistors P1~P4 in a switched-off state That is, the leakage current Ileak, which flows from the word line WL to the bit line BL via the dummy cell DC, is discharged as the discharge current Idis. Therefore, the charges that are precharged in the bit line BL are discharged as the discharge current Idis through the word line WL.

Figure 12:
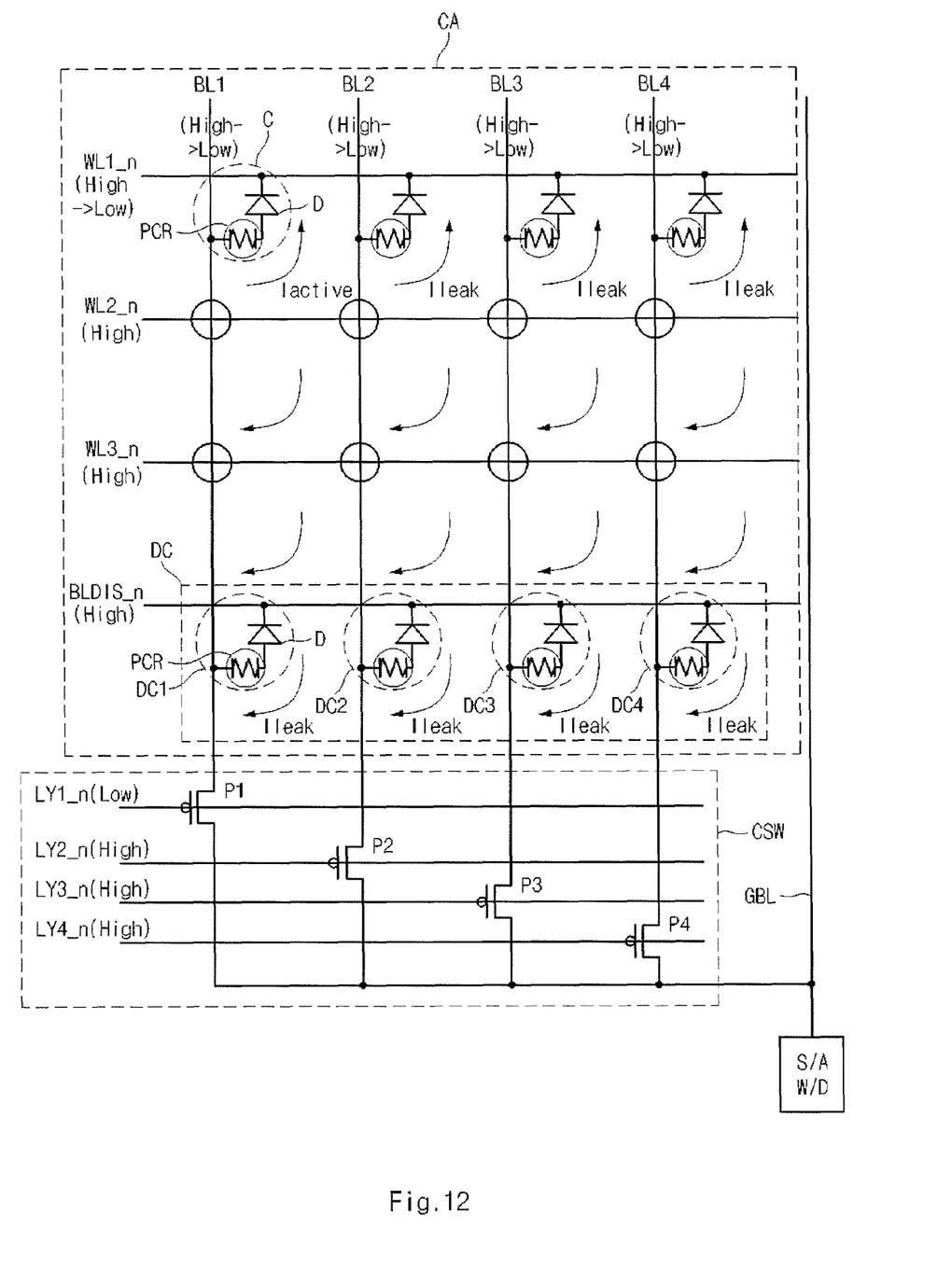
FIG. 12 is a diagram showing an operation of a phase change memory device during a second portion of the active period according to an embodiment of the present invention.

FIG. 12 is a diagram showing a later active operation of a phase change memory device according to an embodiment of the present invention when the mode is changed from the precharge mode to the active mode. The phase change memory device of FIG. 12 has the same structure as that of FIG. 7.

In the later operation from the precharge mode to the active mode, the word line WL1_n is selected from the word lines WL1_n~WL3_n and transitions from the high voltage level to the low voltage level. The bit line discharge signal BLDIS_n transitions from a low voltage level to a high voltage level.

Therefore, the leakage current Ileak, which flows from the selected word line WL1_n to the bit line BL via the dummy cell DC, is not discharged to the terminal receiving the bit line discharge signal BLDIS_n. The column selecting signals LY1_n~LY4_n are maintained at the low level, so as to maintain the PMOS transistors P1~P4 in a switched-on state.

That is, the leakage current Ileak, which flows from the selected word line WL1_n to the bit line BL via the dummy cell DC, is not discharged as the discharge current Idis. As a result, the charges that are precharged in the bit line BL are discharged as an active current Iactive through the selected word line WL1_n.

Figure 13:
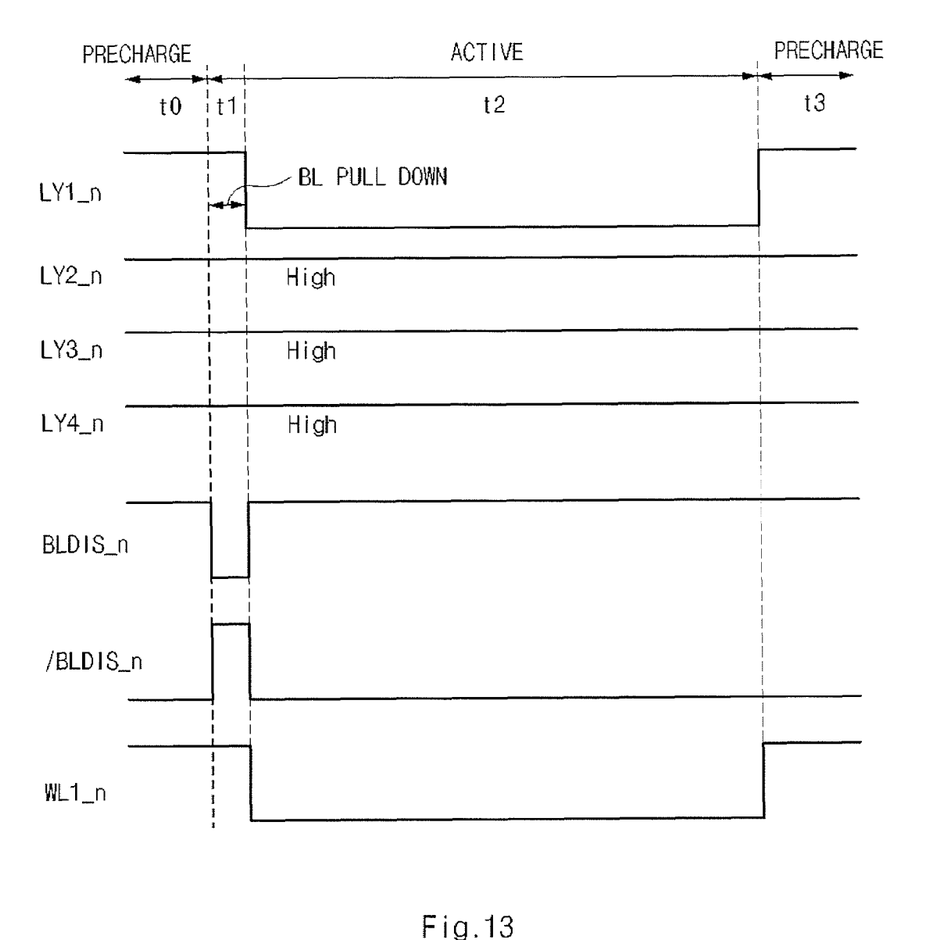
FIG. 13 is a waveform diagram showing an active mode of a phase change memory device according to an embodiment of the present invention.

FIG. 13 is a waveform diagram showing an active mode of a phase change memory device according to an embodiment of the present invention.

In a precharge mode (t0), the column selecting signals LY1_n~LY4_n are maintained at the high voltage level, so as to maintain the column selecting unit CSW in a switched-off state. As a result, the bit line BL is not connected to the global bit line GBL.

In the precharge mode, the bit line discharge signal BLDIS_n maintains a high level so as to disconnect the discharging path of the dummy cell DC. At this time the bit line discharge signal /BLDIS_n transitions to the low level, thereby switching off the local switch LSW.

In the precharge mode (t0), the block selecting signal BS transitions to a low level and the discharge control signal BLDIS_CON transitions to a high level, as a result, the bit line discharge signal BLDIS_n transitions to the high level inactivating the dummy cell DC.

In this case, the bit line discharge signal /BLDIS_n transitions to the low level switching off the local switch LSW, the bit line discharge signal BLDIS_n transitions the high voltage level, and the selected word line WL1_n transitions to the high level to inactivate the unit cell C.

That is, in the precharge mode, the bit line discharge signal is BLDIS_n transitions to the high level so as to disconnect the path which discharges the bit line BL to the ground voltage through the phase change resistor PCR and the diode D.

During a first portion of the active period (t1), the column selecting signals LY1~LY4 maintain a high voltage level. The bit line discharge signal BLDIS_n transitions to the low voltage level. As a result, the bit line BL is discharged through the phase change resistor PCR and the diode D of the dummy cell DC as the discharge current Idis.

During the first portion of the active period (t1) the bit line discharge signal /BLDIS_n transitions to the high voltage level switching on the local switch LSW. As a result, the terminal receiving the bit line discharge signal BLDIS_n transitions to the low voltage level. The selected word line WL1_n keeps the high voltage level inactivating the unit cell C.

During the second portion of the active period (t2), the column selecting signal LY1_n, selected from the column selecting signals LY1~LY4, transitions to the low voltage level. As a result, the PMOS transistor P1 is switched-on connecting the bit line BL1 to the global bit line GBL.

The bit line discharge signal BLDIS_n transitions to the high level and disconnects the discharging path of the dummy cell DC. At this time the bit line discharge signal /BLDIS_n transits to the low level and switches off the local switch LSW. The selected word line WL1_n transitions to the low voltage level thereby operating in the active mode.

During the second period of the active period (t2), the block selecting signal BS transitions to a high level, and the discharge control signal BLDIS_CON transitions to a low level. As a result, the bit line discharge signal BLDIS_n transitions to the high level.

In a precharge mode (t3), both the column selecting signal LY1 and the word line WL1_n transition to the high voltage level.

Therefore, in the precharge period (t0), the discharging path of the dummy cell DC is disconnected, which prevents an excessive leakage current.

When the dummy cell DC does not operate in the precharge mode, the voltage of the bit line BL becomes higher than the snap voltage Vsnapback, which may lead to degradation of the cell. In order to prevent the degradation of the cell, the dummy cell DC operates during the first portion of the active period (t1) for forming the discharging path.

As described above, a phase change memory device according to an embodiment of the present invention uses a phase change resistance cell comprising a dummy cell array to perform a bit line switch function without a circuit for forming a discharging path.

The phase change memory device comprises a dummy cell array forming a discharging path of a bit line to improve a characteristic of a main cell, thereby reducing the layout area.

The phase change memory device comprises a dummy cell array forming a discharging path of a bit line that is activated in an active mode to minimize the dummy cell array leakage current in a precharge mode.

Although a number of illustrative embodiments consistent with the invention have been described, it should be understood that numerous other modifications and embodiments can be devised by those skilled in the art that will fall within the spirit and scope of the principles of this disclosure. More particularly, a number of variations and modifications are possible in the component parts and/or arrangements of the subject combinations arrangement within the scope of the disclosure, the drawings and the appended claims. In addition to variations and modifications in the component parts and/or arrangements, alternative uses will also be apparent to those skilled in the art.

What is claimed is:

1. A phase change memory device comprising:
   a cell array including a plurality of word lines and a plurality of bit lines, the cell array comprising:
      a phase change resistance cell arranged at an intersection of a word line and a bit line; and
      a dummy cell discharging the bit line in response to a first bit line discharge signal; and
   a column switching unit selectively controlling a connection between the bit line and a global bit line in response to a column selecting signal,
   wherein the dummy cell discharges the bit line in response to the first bit line discharge signal during a first period of an active mode, and disconnects a discharging path in a precharge mode in response to the first bit line discharge signal.

2. The phase change memory device according to claim 1, wherein the dummy cell has the same structure as the phase change resistance cell.

3. The phase change memory device according to claim 1, wherein the phase change resistance cell comprises:
   a phase change resistor sensing a crystallization phase and storing a data corresponding to a resistance change, wherein the crystallization phase varies depending on currents; and
   a diode connected between the phase change resistor and the word line.

4. The phase change memory device according to claim 1, wherein the dummy cell comprises:
   a phase change resistor connected to the bit line, the phase change resistor sensing a crystallization phase and storing a data corresponding to a resistance change, wherein the crystallization phase varies depending on currents; and
   a diode connected between the phase change resistor and a terminal receiving the first bit line discharge signal.

5. The phase change memory device according to claim 4, wherein the diode comprises a PN diode.

6. The phase change memory device according to claim 5, wherein the diode comprises a P-type region connected to the phase change resistor and an N-type region connected to the terminal receiving the first bit line discharge signal.

7. The phase change memory device according to claim 1, wherein the first bit line discharge signal is inactivated in the precharge mode and activated in the active mode.

8. The phase change memory device according to claim 1, wherein the column switching unit comprises a PMOS transistor having a gate, wherein the gate of the PMOS transistor receives the column selecting signal.

9. The phase change memory device according to claim 8, wherein the column selecting signal is inactivated in the precharge mode.

10. The phase change memory device according to claim 1, wherein in the precharge mode a high voltage level is applied to the word line and the first bit line discharge signal is inactivated.

11. The phase change memory device according to claim 1, wherein during the first period of the active mode, a high voltage level is applied to the word line and the first bit line discharge signal is activated to a low level to form a discharging path.

12. The phase change memory device according to claim 1, wherein during a second period of the active mode, a low voltage level is applied to one word line selected from the plurality of word lines, and the first bit line discharge signal is activated disconnecting the discharging path.

13. The phase change memory device according to claim 12, wherein a column selecting signal corresponding to the selected word line transitions to a low voltage level when the discharging path is disconnected switching on a PMOS transistor of the column switching unit and connecting the bit line to the global bit line.

14. The phase change memory device according to claim 1, further comprising a local switch discharging a terminal receiving the first bit line discharge signal in response to a second bit line discharge signal during the first period of the active mode.

15. The phase change memory device according to claim 14, wherein the local switch comprises a MOS transistor connected between the terminal receiving the first bit line discharge signal and a ground voltage terminal, and controlled by the second bit line discharge signal.

16. The phase change memory device according to claim 14, wherein the second bit line discharge signal is an inversion signal of the first bit line discharge signal.

17. The phase change memory device according to claim 1, further comprising a decoder receiving a block selecting signal for selecting a cell array block and a discharge control signal, and outputting the first bit line discharge signal and the second bit line discharge signal.

18. The phase change memory device according to claim 17, wherein the decoder outputs the first bit line discharge signal having a high level and outputs the second bit line discharge signal having a low level when the block selecting signal and the discharge control signal are inactivated in the precharge mode.

19. The phase change memory device according to claim 17, wherein the decoder outputs the first bit line discharge signal having a low level and the second bit line discharge signal having a high level when the block selecting signal and the discharge control signal are activated during the first period of the active mode.

* * * * *